(12) United States Patent
Yoshimura et al.

(10) Patent No.: US 11,289,505 B2
(45) Date of Patent: Mar. 29, 2022

(54) SEMICONDUCTOR MEMORY DEVICE

(71) Applicant: KIOXIA CORPORATION, Tokyo (JP)

(72) Inventors: Naoya Yoshimura, Kuwana Mie (JP); Keisuke Nakatsuka, Kobe Hyogo (JP)

(73) Assignee: Kioxia Corporation, Tokyo (JP)

( * ) Notice: Subject to any disclaimer, the term of this patent is extended or adjusted under 35 U.S.C. 154(b) by 91 days.

(21) Appl. No.: 16/801,336

(22) Filed: Feb. 26, 2020

(65) Prior Publication Data
US 2021/0020655 A1 Jan. 21, 2021

(30) Foreign Application Priority Data

Jul. 19, 2019 (JP) .............................. JP2019-133747

(51) Int. Cl.
| | |
|---|---|
| *H01L 27/11582* | (2017.01) |
| *G11C 7/18* | (2006.01) |
| *G11C 8/14* | (2006.01) |
| *H01L 27/1157* | (2017.01) |
| *H01L 27/11524* | (2017.01) |
| *H01L 27/11556* | (2017.01) |
| *H01L 27/11565* | (2017.01) |
| *H01L 27/11519* | (2017.01) |

(52) U.S. Cl.
CPC .......... *H01L 27/11582* (2013.01); *G11C 7/18* (2013.01); *G11C 8/14* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ................................................. H01L 27/11582
See application file for complete search history.

(56) References Cited

U.S. PATENT DOCUMENTS

| | | |
|---|---|---|
| 9,806,091 B2 | 10/2017 | Miyagawa |
| 2017/0373082 A1 | 12/2017 | Sekine |
| 2019/0080727 A1 | 3/2019 | Suzuki |
| 2019/0088674 A1 | 3/2019 | Konno |

FOREIGN PATENT DOCUMENTS

| | | |
|---|---|---|
| JP | 2019-050069 A | 3/2019 |
| WO | WO-2016/135849 A1 | 9/2016 |

*Primary Examiner* — Christopher A Johnson
(74) *Attorney, Agent, or Firm* — Foley & Lardner LLP

(57) ABSTRACT

A semiconductor memory device according to an embodiment includes a substrate, first to eleventh conductive layers, first and second pillars, and first to fourth insulating regions. The first insulating regions are provided between the third and fifth conductive layers and between the fourth and sixth conductive layers. The second insulating regions are provided between the eighth and tenth conductive layers and between the ninth and eleventh conductive layers. The third insulating region is provided between the third to sixth conductive layers and the eighth to eleventh conductive layers. The fourth insulating region is provided between the second and seventh conductive layers. The fourth insulating region is separated from the third insulating region in a planar view.

18 Claims, 10 Drawing Sheets

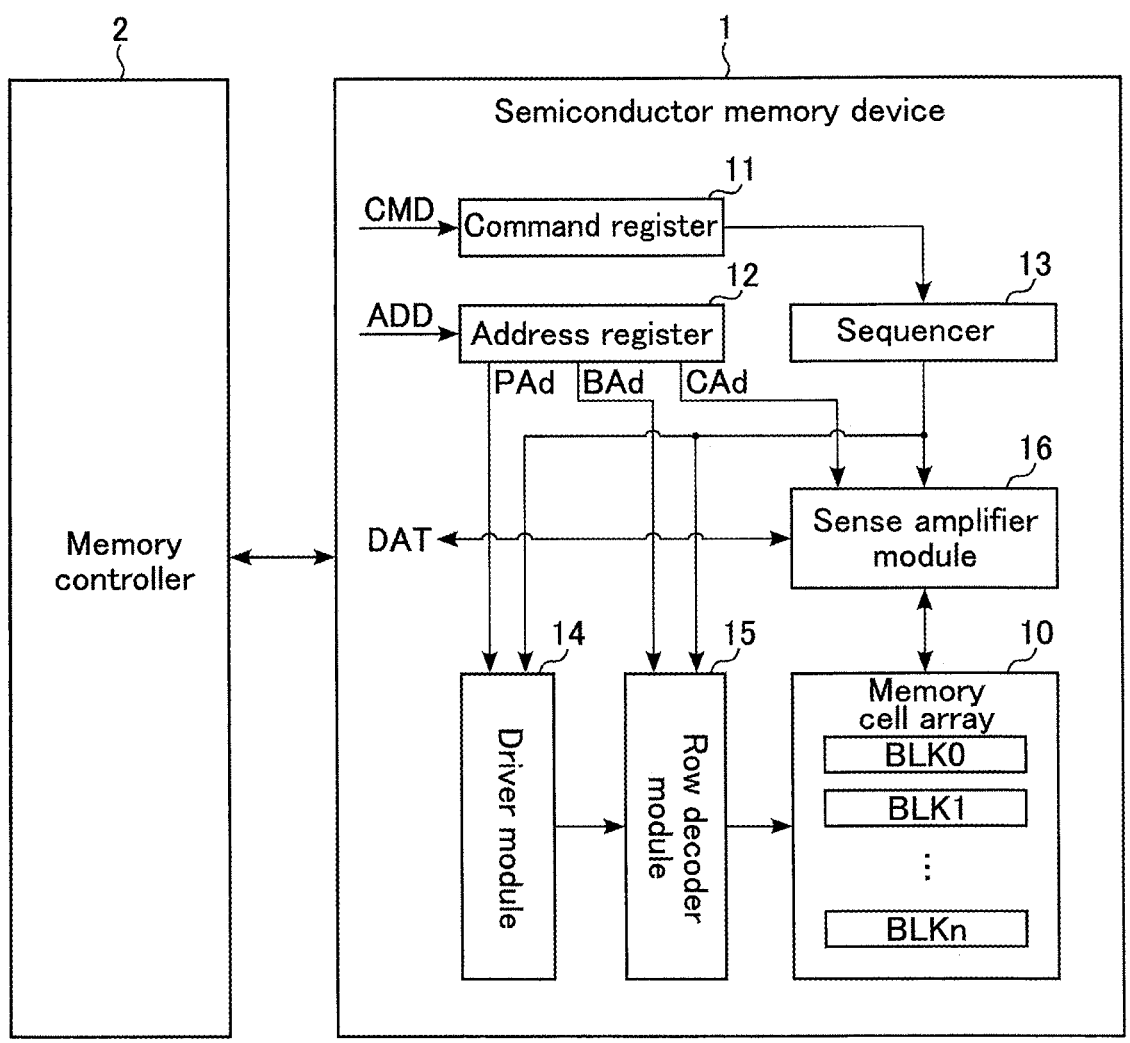
F I G. 1

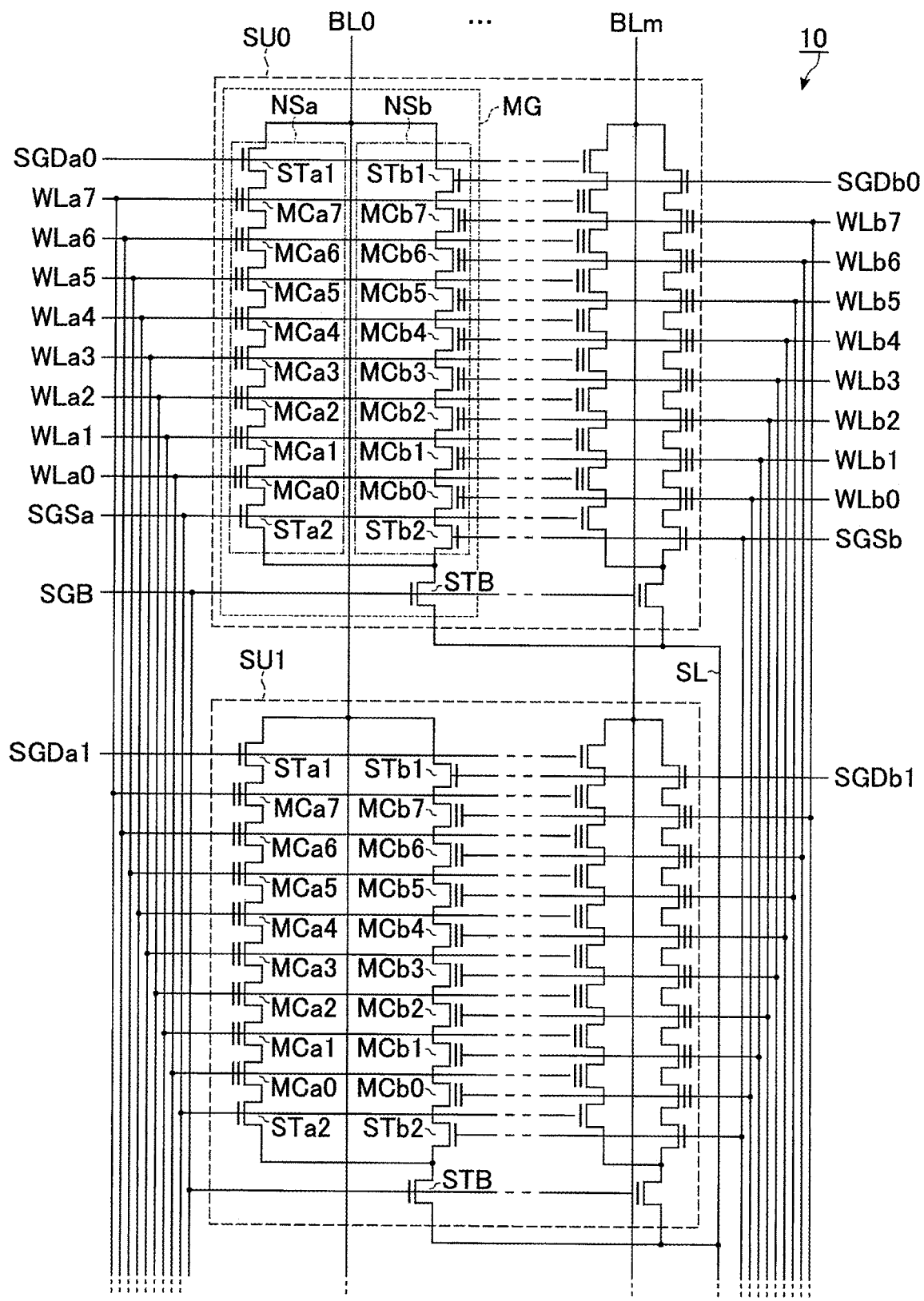
F I G. 2

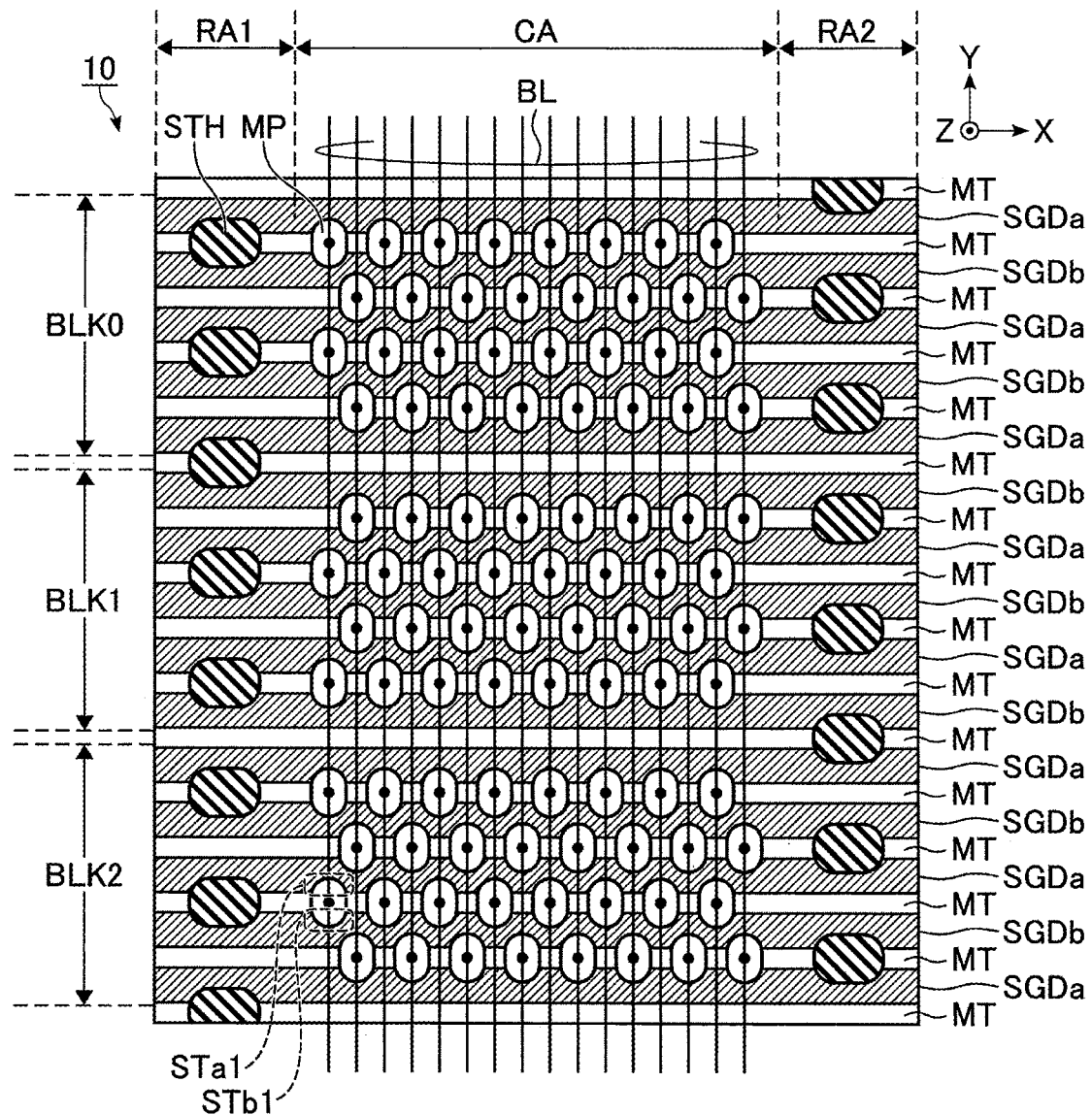
F I G. 3

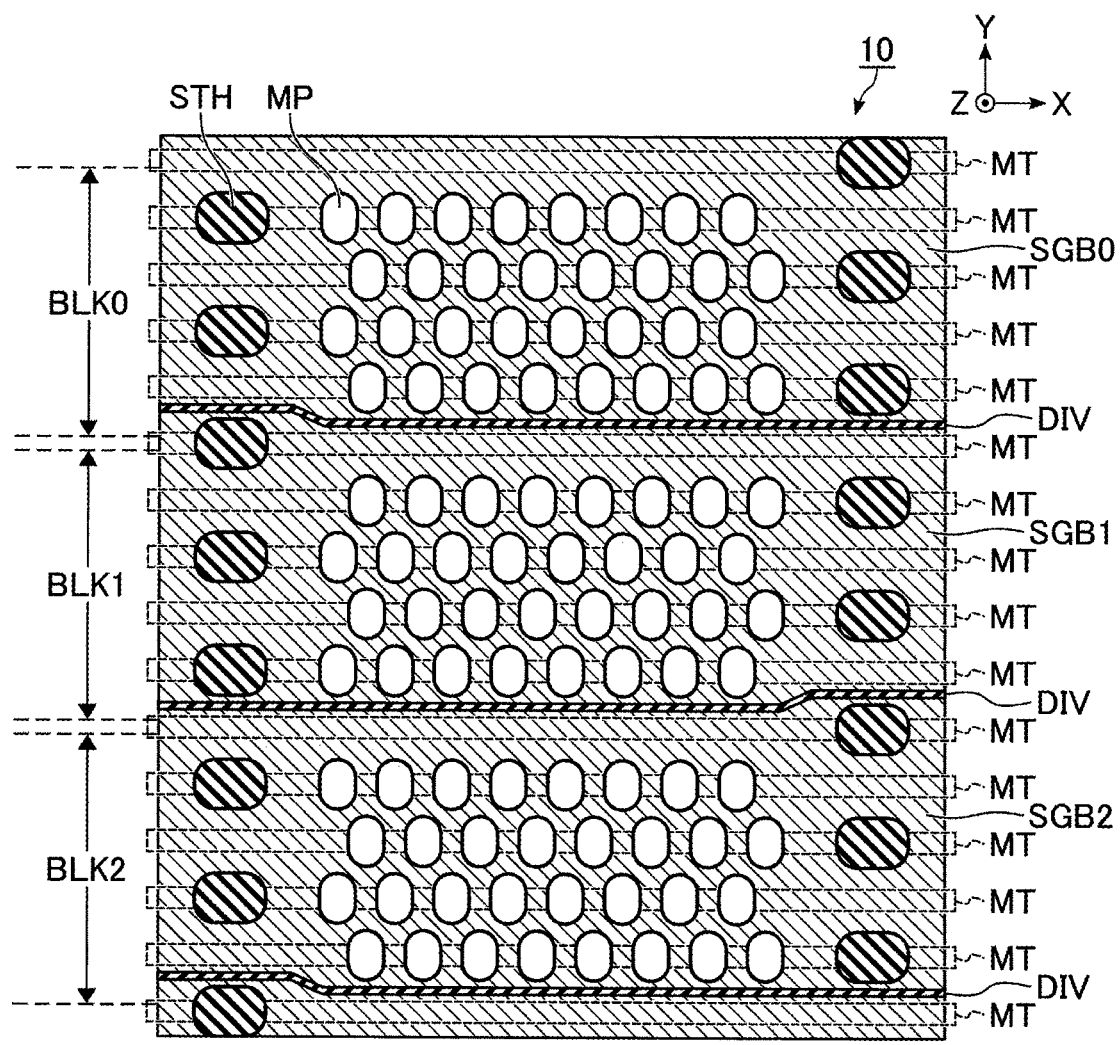
F I G. 4

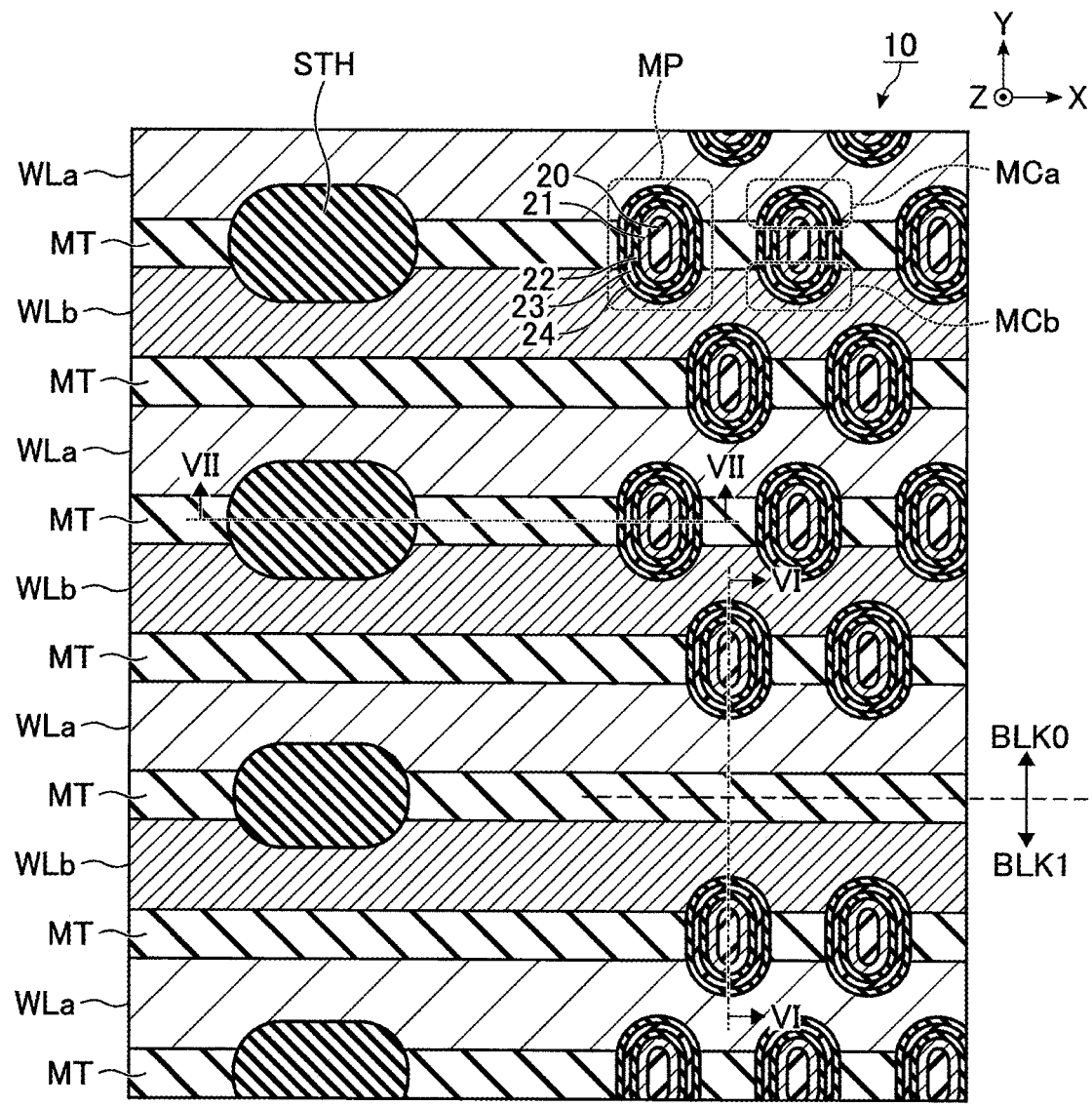
F I G. 5

SEMICONDUCTOR MEMORY DEVICE

CROSS-REFERENCE TO RELATED APPLICATIONS

This application is based upon and claims the benefit of priority from Japanese Patent Application No. 2019-133747, filed Jul. 19, 2019, the entire contents of which are incorporated herein by reference.

FIELD

Embodiments described herein relate generally to a semiconductor memory device.

BACKGROUND

There is known a NAND-type flash memory that is capable of storing data in a nonvolatile manner.

BRIEF DESCRIPTION OF THE DRAWINGS

FIG. 1 is a block diagram showing an exemplary configuration of a semiconductor memory device according to an embodiment.

FIG. 2 is a circuit diagram showing an exemplary circuit configuration of a memory cell array in the semiconductor memory device according to the embodiment.

FIG. 3 is a plan view showing an exemplary planar layout of a memory cell array in the semiconductor memory device according to the embodiment.

FIG. 4 is a plan view showing an exemplary planar layout of a memory cell array in the semiconductor memory device according to the embodiment.

FIG. 5 is a plan view showing an exemplary planar layout of a memory cell array in the semiconductor memory device according to the embodiment.

DETAILED DESCRIPTION

Figure 6:
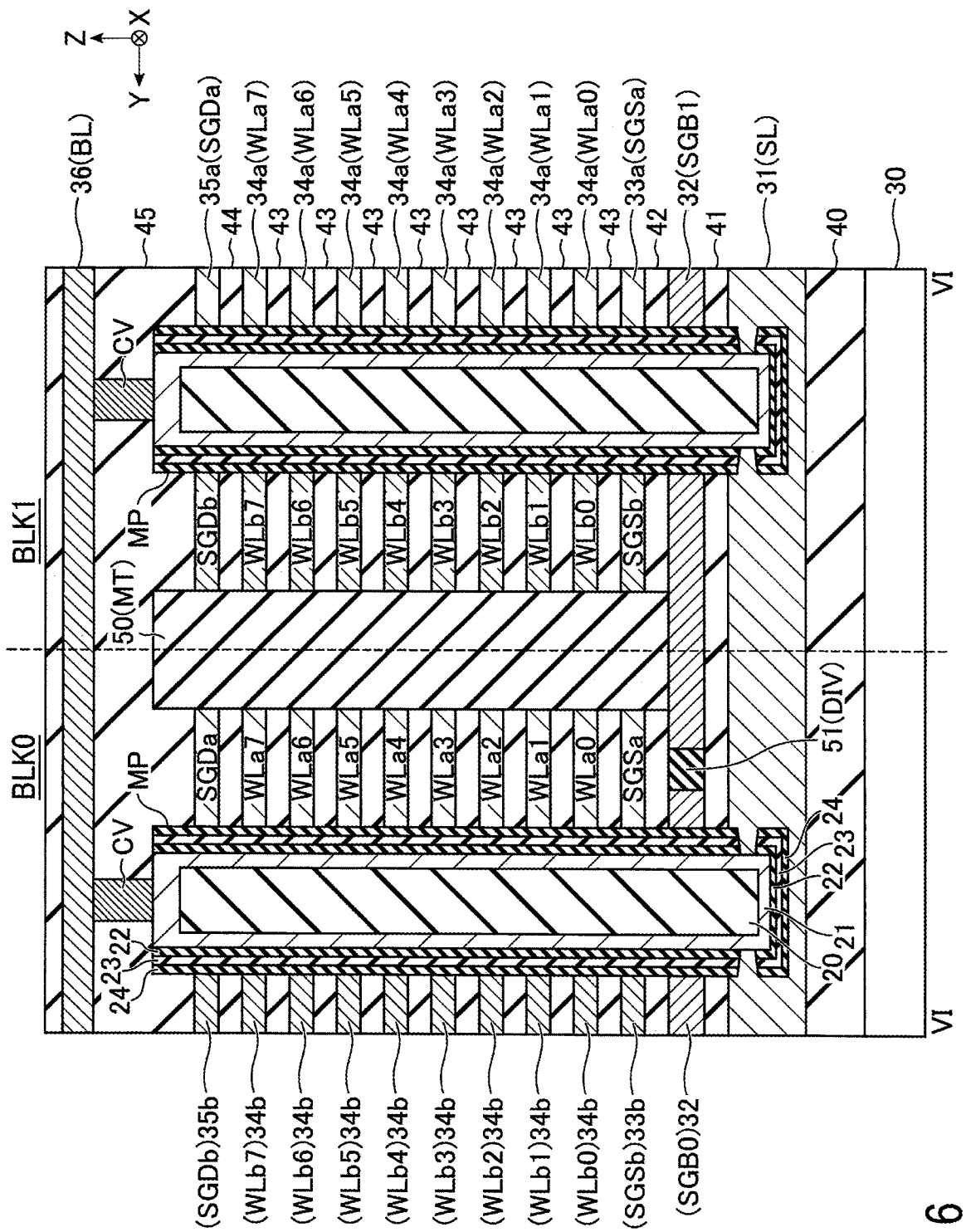
FIG. 6 is a cross-sectional view, taken along line VI-VI in FIG. 5, showing an exemplary cross-sectional structure of the memory cell array in the semiconductor memory device according to the embodiment.

In general, according to one embodiment, a semiconductor memory device includes a substrate, first to eleventh conductive layers, first and second pillars, a plurality of first insulating regions, a plurality of second insulating regions, a third insulating region, and a fourth insulating region. The first conductive layer is provided above the substrate. The second conductive layer is provided above the first conductive layer. The third conductive layer and a fourth conductive layer are provided above the second conductive layer. The third conductive layer and the fourth conductive layer are separated from each other in a first direction. The fifth conductive layer is provided in the same level of a layered structure as the third conductive layer above the second conductive layer. The fifth conductive layer is separated from the third conductive layer. The sixth conductive layer is provided in the same level of the layered structure as the fourth conductive layer above the second conductive layer. The sixth conductive layer is separated from the fourth conductive layer. The first insulating regions are provided between the third conductive layer and the fifth conductive layer and between the fourth conductive layer and the sixth conductive layer, along a second direction intersecting the first direction. The first pillar is provided between the first insulating regions and penetrating the second conductive layer along the first direction. The first pillar includes a first semiconductor layer and a first insulating layer. The first semiconductor layer is in contact with the first conductive layer. The first insulating layer is provided between the first semiconductor layer and the second to sixth conductive layers. The seventh conductive layer is provided in the same level of the layered structure as the second conductive layer above the first conductive layer. The seventh conductive layer is separated from the second conductive layer. The eighth conductive layer and the ninth conductive layer are provided above the seventh conductive layer and being separated from each other in the first direction. The tenth conductive layer is provided in the same level of the layered structure as the eighth conductive layer above the seventh conductive layer. The tenth conductive layer is separated from the eighth conductive layer. The eleventh conductive layer is provided in the same level of the layered structure as the ninth conductive layer above the seventh conductive layer. The eleventh conductive layer is separated from the ninth conductive layer. The second insulating regions are provided along the second direction between the eighth conductive layer and the tenth conductive layer and between the ninth conductive layer and the eleventh conductive layer. The second pillar is provided between the second insulating regions and penetrating the seventh conductive layer along the first direction. The second pillar includes a second semiconductor layer and a second insulating layer. The second semiconductor layer is in contact with the first conductive layer. The second insulating layer is provided between the second semiconductor layer and the seventh to eleventh conductive layers. The third insulating region is provided between the third to sixth conductive layers and the eighth to eleventh conductive layers along the second direction. The fourth insulating region is provided between the second conductive layer and the seventh conductive layer. The fourth insulating region is separated from the third insulating region in a planar view.

The embodiments will be explained below by referring to the drawings. The embodiments exemplify the device and method that realize the technical concept of the invention. The drawings are provided merely for schematic or conceptual purposes, and thus may not be identical to reality in dimension and proportion. Furthermore, the technical concept of the invention is not limited by the form, structure, arrangement or the like of the structural components.

In the following explanation, structural components having the same functions and structures will be referred to by the same reference symbols. Numerals attached to letters in a reference symbol of a component are used to distinguish this component from other components of the same structure that are referenced by symbols containing the same letters.

Similarly, letters attached to numerals of a reference symbol of a component is used to distinguish this component from other components of the same structure that are referenced by symbols containing the same numerals. When the components having reference symbols that contain the same letters or numerals need not be distinguished from each other, these components may be referred to by a reference symbol containing the letters or numerals only.

[1] Embodiments

A semiconductor memory device 1 according to the embodiment will be described below.

[1-1] Configuration of Semiconductor Memory Device 1

[1-1-1] Overall Configuration of Semiconductor Memory Device 1

FIG. 1 shows an exemplary configuration of the semiconductor memory device 1 according to the embodiment. The semiconductor memory device 1 is a NAND flash memory configured to store data in a nonvolatile manner, and may be controlled by an external memory controller 2.

As illustrated in FIG. 1, the semiconductor memory device 1 may include a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer larger than or equal to 1). A block BLK is a set of memory cells that can store data in a nonvolatile manner, and may be used as a data erase unit. The memory cell array 10 is provided with a plurality of bit lines and word lines. Each memory cell is associated with one bit line and one word line. The structure of the memory cell array 10 will be discussed later in detail.

The command register 11 holds a command CMD that the semiconductor memory device 1 receives from the memory controller 2. A command CMD may include commands for causing the sequencer 13 to execute read, write, and erase operations or the like.

The address register 12 holds address information ADD that the semiconductor memory device 1 receives from the memory controller 2. The address information ADD may include a block address BAd, a page address PAd, and a column address CAd. The block address BAd, page address PAd, and column address CAd may be used for selection of a block BLK, a word line, and a bit line, respectively.

The sequencer 13 controls the overall operation of the semiconductor memory device 1. For example, the sequencer 13 may control the driver module 14, row decoder module 15, and sense amplifier module 16, based on a command CMD held in the command register 11, thereby executing a read operation, write operation, and erase operation.

The driver module 14 generates a voltage to be used for the read operation, write operation, and erase operation. The driver module 14 may then apply the generated voltage to the signal line corresponding to the selected word line, based on the page address PAd held in the address register 12.

The row decoder module 15 selects, based on the block address BAd held in the address register 12, the corresponding one of the blocks BLK in the memory cell array 10. Then, the row decoder module 15 transfers the voltage applied to the signal line corresponding to the selected word line, to this selected word line in the selected block BLK.

In a write operation, the sense amplifier module 16 applies a desired voltage to each bit line in accordance with write data DAT received from the memory controller 2. Furthermore, in a read operation, the sense amplifier module 16 determines the data stored in a memory cell based on the voltage of the bit line, and transfers the determination result as the read data DAT to the memory controller 2.

The above-mentioned semiconductor memory device 1 and memory controller 2 may be combined into a single semiconductor device. Examples of such semiconductor devices include a memory card such as an SD™ card, and a solid state drive (SSD).

[1-1-2] Circuit Configuration of Memory Cell Array 10

FIG. 2 shows an exemplary circuit configuration of the memory cell array 10 according to the embodiment. Each block BLK includes, for example, four string units SU0 to SU3. Two of the string units included in the same block BLK, string units SU0 and SU1, are illustrated in FIG. 2.

As illustrated in FIG. 2, each string unit SU includes a plurality of memory groups MG. Every memory group MG is associated with one of bit lines BL0 to BLm (where m is an integer greater than or equal to 1), and includes two NAND strings NSa and NSb, as well as a select transistor STB. The NAND string NSa includes memory cell transistors MCa0 to MCa7, and select transistors STa1 and STa2. The NAND string NSb includes memory cell transistors MCb0 to MCb7, and select transistors STb1 and STb2.

The select transistor STB is used for the selection of a string unit SU. The select transistors STa1 and STb1 and the select transistors STa2 and STb2 are used for selection of a string unit SU and NAND string NS. Each of the memory cell transistors MCa and MCb includes a control gate and charge storage layer, and stores data in a nonvolatile manner. An exemplary connection of the elements in the memory group MG will be explained below by focusing on one memory group MG.

In the NAND string NSa, the memory cell transistors MCa0 to MCa7 are coupled in series with each other. The source of the select transistor STa1 is coupled to one end of the series-coupled memory cell transistors MCa0 to MCa7. The other end of the series-coupled memory cell transistors MCa0 to MCa7 is coupled to the drain of the select transistor STa2.

In the NAND string NSb, the memory cell transistors MCb0 to MCb7 are coupled in series with each other. The source of the select transistor STb1 is coupled to one end of the series-coupled memory cell transistors MCb0 to MCb7. The other end of the series-coupled memory cell transistors MCb0 to MCb7 is coupled to the drain of the select transistor STb2.

The drains of the select transistors STa1 and STb1 are commonly coupled to the bit line BL associated with this memory group MG. The sources of the select transistors STa2 and STb2 are commonly coupled to the drain of the select transistor STB. The source of the select transistor STB is coupled to the source line SL.

The gates of the select transistors STa1 in the same block BLK are coupled to a select gate line SGDa that is commonly shared in every string unit SU. In particular, the select transistors STa1 in the string unit SU0 are commonly coupled to the select gate line SGDa0. The select transistors STa1 in the string unit SU1 are commonly coupled to the select gate line SGDa1. Similarly, the select transistors STa1 in the string unit SU2 and SU3 (not shown) are commonly coupled to the select gate lines SGDa2 and SGDa3, respectively.

The gates of the select transistors STb1 in the same block BLK are coupled to the select gate line SGDb that is common for the string unit SU. In particular, the select transistors STb1 in the string unit SU0 are commonly coupled to the select gate line SGDb0. The select transistors STb1 in the string unit SU1 are commonly coupled to the select gate line SGDb1. Similarly, the select transistors STb1 in the string unit SU2 and SU3 (not shown) are commonly coupled to the select gate lines SGDb2 and SGDb3, respectively.

The control gates of the memory cell transistors MCa0 to MCa7 in the same block BLK are commonly coupled to the corresponding one of the word lines WLa0 to WLa7. The control gates of the memory cell transistors MCb0 to MCb7 in the same block BLK are commonly coupled to the corresponding one of the word lines WLb0 to WLb7.

The gates of the select transistors STa2 in the same block BLK are commonly coupled to the select gate line SGSa. The gates of the select transistors STb2 in the same block BLK are commonly coupled to the select gate line SGSb. The gates of the select transistors STB in the same block BLK are commonly coupled to the select gate line SGB.

In the above-explained circuit configuration of the memory cell array 10, a bit line BL is shared, for example, by a memory group MG (pair of NAND strings NSa and NSb) to which the same column address is assigned. A source line SL is shared among a plurality of blocks BLK. A select gate line SGB is provided for each block BLK. The word lines WLa and WLb, select gate lines SGDa and SGDb, and select gate lines SGSa, SGSb and SGB may be independently controlled.

In the above explanation, the select gate lines SGDa0 to SGDa3 and SGDb0 to SGDb3 are independently provided. The select gate lines SGD, however, may be shared with an adjacent string unit SU. If this is the case, one wiring corresponding to a select gate line SGD may be provided with two functions of select gate lines SGD from among the select gate lines SGDa0 to SGDa3 and SGDb0 to SGDb3. Alternatively, two or more wirings may be provided with one function of a select gate line SGD.

[1-1-3] Structure of Memory Cell Array 10

An exemplary structure of the memory cell array 10 in the semiconductor memory device 1 according to the embodiment will be described below. In the drawings mentioned below, the X direction corresponds to the direction of extension of the word lines WL, the Y direction corresponds to the direction of extension of the bit lines BL, and the Z direction corresponds to the direction vertical to the surface of a semiconductor substrate 30 that is used for the formation of the semiconductor memory device 1. The plan views are provided with a hatch pattern, as needed, to enhance visibility. This hatch pattern, however, may not relate to the materials or properties of the hatch-lined structural components.

(Planar Layout of Memory Cell Array 10)

FIG. 3 shows an exemplary planar layout of the memory cell array 10 according to the embodiment, focusing on the select gate lines SGDa and SGDb. In FIG. 3, the areas corresponding to three blocks BLK0 to BLK2 arranged in this order are focused on. As illustrated in FIG. 3, the area of the memory cell array 10 includes a cell area CA and replacement areas RA1 and RA2. Furthermore, the memory cell array 10 includes a plurality of memory trenches MT, memory pillars MP, and replacement holes STH.

The cell area CA and replacement areas RA1 and RA2 each extend in the Y direction. The cell area CA is interposed between the replacement area RA1 and RA2 in the X direction. The select gate lines SGDa and SGDb each include a portion extending in the X direction across the cell area CA and replacement areas RA1 and RA2. The select gate lines SGDa and SGDb are alternately provided in the Y direction.

A memory trench MT is arranged between adjacent select gate lines SGDa and SGDb. The memory trench MT includes a portion extending in the X direction, separating the wiring layers that are adjacent in the Y direction. An insulator may be embedded in the memory trenches MT.

Each memory pillar MP functions as a memory group MG, and is arranged to overlap one memory trench MT in the cell area CA. Each memory pillar MP divides the overlapping memory trench MT, and is in contact with both select gate lines SGDa and SGDb, which are adjacent to the divided memory trench MT. The portion where the memory pillar MP and select gate line SGDa face each other functions as a select transistor STa1. The portion where the memory pillar MP and select gate line SGDb face each other functions as a select transistor STb1.

Each memory pillar MP is arranged to overlap at least one bit line BL and is electrically coupled to a bit line BL. In the area corresponding to a block BLK, four rows of memory pillars MP are arranged to form a staggered pattern. At the boundary of any adjacent two blocks BLK, a memory trench MT that no memory pillar MP overlaps is arranged. In other words, the memory cell array 10, where it is partitioned by a memory trench MT that no memory pillar MP overlaps, is divided into blocks BLK.

The replacement holes STH are used for forming layered wirings. The replacement holes STH may include replacement holes STH that overlap the even-numbered memory trenches MT in the replacement area RA1, and replacement holes STH that overlap the odd-numbered memory trench MT in the replacement area RA2. Each replacement hole STH divides the overlapping memory trench MT, and is in contact with both select gate lines SGDa and SGDb, which are adjacent to this memory trench MT. An insulator may be embedded in the replacement holes STH.

FIG. 4 shows an exemplary planar layout of the memory cell array 10 according to the embodiment, focusing on the select gate lines SGB. An area similar to FIG. 3 is focused on in FIG. 4. As illustrated in FIG. 4, the memory cell array 10 further includes a plurality of slits DIV.

Each select gate line SGB includes a portion extending in the X direction across the cell area CA and replacement areas RA1 and RA2. The memory pillars MP and replacement holes STH penetrate the select gate line SGB. The portion where the memory pillar MP and select gate line SGB face each other functions as a select transistor STB.

A slit DIV includes a portion extending in the X direction, separating two select gate lines SGB adjacent to each other in the Y direction. In other words, a slit DIV is arranged between two adjacent select gate lines SGB of two adjacent blocks BLK. In addition, the select gate lines SGB and slits DIV are alternately provided in the Y direction. An insulator may be embedded in the slits DIV.

In the memory cell array 10 according to the present embodiment, the memory pillars MP, memory trenches MT, and replacement holes STH are provided separately from the slits DIV. That is, each slit DIV is slightly shifted to one of the adjacent blocks BLK, with reference to the memory trench MT at the boundary of the blocks BLK. A slit DIV is therefore arranged to overlap a select gate line SGD or word line WL positioned at the end portion of one of the adjacent blocks BLK. Preferably, all the slits DIV may be shifted in the same direction so that the select gate lines SGB can attain a uniform resistance. If this is the case, a single slit DIV overlaps the wiring layers (e.g., select gate line SGD and word lines WL) in every block BLK.

FIG. 5 shows an exemplary planar layout of the memory cell array 10 according to the embodiment, focusing on the word lines WLa and WLb. In FIG. 5, an area that includes a memory trench MT and replacement hole STH at the boundary of the blocks BLK0 and BLK1 is illustrated. As illustrated in FIG. 5, a memory pillar MP includes a core member 20, a semiconductor layer 21, a tunnel insulating film 22, an insulating film 23, and a block insulating film 24.

Each of the word lines WLa and WLb includes a portion extending in the X direction across the cell area CA and replacement areas RA1 and RA2. The word lines WLa and WLb are alternately provided in the Y direction, with a memory trench MT arranged between. That is, each of the word lines WLa and WLb includes a portion in contact with the memory pillar MP and replacement hole STH.

Furthermore, the set of word lines WLa and the set of word lines WLb in each block BLK are respectively configured to have their end portions electrically connected to each other. For instance, an electrical connection of the word lines WL may be established in a block BLK by shaping a set of word lines WL in the form of a comb. The connection is not limited thereto, however. A set of linear word lines WL in a block BLK may be electrically connected by way of different wirings to establish an electrical connection.

The core member 20 is arranged in the center of the memory pillar MP. The semiconductor layer 21 surrounds the core member 20. The tunnel insulating film 22 surrounds the semiconductor layer 21. The insulating film 23 surrounds the tunnel insulating film 22. The block insulating film 24 surrounds the insulating film 23. The block insulating film 24 is in contact with the adjacent word lines WLa and WLb, as well as with the memory trench MT between the adjacent word lines WLa and WLb.

The portion where the memory pillar MP and word line WLa face each other functions as a memory cell transistor MCa. The portion where the memory pillar MP and word line WLb face each other functions as a memory cell transistor MCb. The core member 20 may include an insulator such as silicon oxide ($SiO_2$). The semiconductor layer 21 may include silicon (Si). The tunnel insulating film 22 and block insulating film 24 may each include silicon oxide ($SiO_2$). The insulating film 23 may include silicon nitride (SiN)

(Cross-Sectional Structure of Memory Cell Array 10)

FIG. 6 is a cross-sectional view of the structure of FIG. 5 taken along the line VI-VI, showing an exemplary cross-sectional structure of the memory cell array 10 including a memory trench MT and memory pillars MP at the boundary of the blocks BLK0 and BLK1. As illustrated in FIG. 6, the memory cell array 10 includes, for example, conductive layers 31, 32, 33a, 33b, 34a, 34b, 35a, 35b and 36, insulating layers 40 to 45, insulators 50 and 51, and a plurality of contacts CV. The cross-sectional structure of the memory cell array 10 will be explained in detail below, in ascending order.

The conductive layer 31 is provided on the semiconductor substrate 30, with the insulating layer 40 interposed between. The insulating layer 40 may include circuits such as a sense amplifier module 16 (not shown) inside. The conductive layer 31 may be formed into a plate expanding along the XY plane, and is used as a source line SL. The conductive layer 31 may include phosphorus (P)-doped silicon (Si). The conductive layer 31 may include multiple types of semiconductor layers or may include a metal layer.

The conductive layer 32 is provided on the conductive layer 31 with the insulating layer 41 interposed between. The conductive layer 32 is formed into a plate expanding in the XY plane, and is used as a select gate line SGB. The conductive layer 32 also serves as an etch stopper during the production of the semiconductor memory device 1. The conductive layer 32 may include phosphorus (P)-doped silicon (Si).

The conductive layer 33 is provided on the conductive layer 32 with the insulating layer 42 interposed between. The conductive layer 33 may be formed into a plate expanding in the XY plane, and is used as a select gate line SGS. The conductive layer 33 may include tungsten (W).

The insulating layers 43 and conductive layers 34 are alternately stacked on the conductive layer 33. A conductive layer 34 may be formed into a plate expanding along the XY plane. The stacked conductive layers 34 are used as word lines WL0 to WL7, in ascending order from the side of the semiconductor substrate 30. The conductive layers 34 may include tungsten (W).

A conductive layer 35 is provided on the topmost conductive layer 34, with the insulating layer 44 interposed between. The conductive layer 35 may be formed into a plate expanding in the XY plane, and is used as a select gate line SGD. The conductive layer 35 may include tungsten (W).

A conductive layer 36 is provided on the conductive layer 35 with the insulating layer 45 interposed between. The conductive layer 36 may be formed into a line extending in the Y direction, and is used as a bit line BL. That is, a plurality of conductive layers 36 are arranged along the X direction in a region that is not shown in the drawings. The conductive layer 36 may include copper (Cu).

Each memory pillar MP extends in the Z direction, penetrating the conductive layers 32 to 35 and the insulating layers 41 to 44. The core member 20 of the memory pillar MP is arranged to extend along the Z direction. The top end of the core member 20 is included in a level of the stacked structure above the conductive layer 35. The bottom end of the core member 20 is included in a level in which the conductive layer 31 is arranged. The semiconductor layer 21 surrounds the core member 20. The tunnel insulating film 22 covers the peripheral and bottom surfaces of the semiconductor layer 21. The insulating film 23 covers the peripheral and bottom surfaces of the tunnel insulating film 22. The block insulating film 24 covers the peripheral and bottom surfaces of the insulating film 23. The conductive layer 31 is in contact with the semiconductor layer 21 with the peripheral surface of the memory pillar MP interposed between.

A pillar-shaped contact CV is provided on the semiconductor layer 21 in the memory pillar MP. A conductive layer 36 (bit line BL) is provided on the contact CV, in contact therewith. The memory pillars MP corresponding to the memory groups MG associated with the same column address are coupled to a common conductive layer 36, with a contact CV interposed between.

The memory trench MT separates the conductive layer 33 to 35 and the insulating layers 42 to 44. An insulator 50 may be embedded in the memory trench MT. The top end of the insulator 50 is in contact with the insulating layer 45. The bottom end of the insulator 50 is in contact with the conductive layer 32. Multiple types of materials may be embedded in the memory trench MT, which suffice as long as the memory trench MT can insulate the adjacent conductive layers from each other.

As a result, the conductive layer 33 is divided into conductive layers 33a and 33b, which correspond to the select gate lines SGSa and SGSb, respectively. The conductive layer 34 is divided into conductive layers 34a and 34b, which correspond to the word lines WLa and WLb, respectively. The conductive layer 35 is divided into conductive layers 35a and 35b, which correspond to the select gate lines SGDa and SGDb, respectively.

The slit DIV divides the conductive layer 32. An insulator 51 is embedded in the slit DIV. The top end of the insulator 51 is in contact with the insulating layer 42. The bottom end of the insulator 51 is in contact with the insulating layer 41. Furthermore, the slit DIV is arranged apart from both the memory pillars MP and memory trenches MT. The insulator 51 and insulating layer 42 may be formed as an integrated body. Multiple types of materials may be embedded in the slit DIV, which suffice as long as the slit DIV can insulate the adjacent conductive layers from each other.

With the above arrangement, the conductive layer 32 is divided for each block BLK. Specifically, the conductive layer 32 is divided by the slit DIV into the conductive layer 32 corresponding to the select gate line SGB0 of the block BLK0 and the conductive layer 32 corresponding to the select gate line SGB1 of the block BLK1. The conductive layer 32 is also divided between other blocks BLK by the slits DIV.

Figure 7:
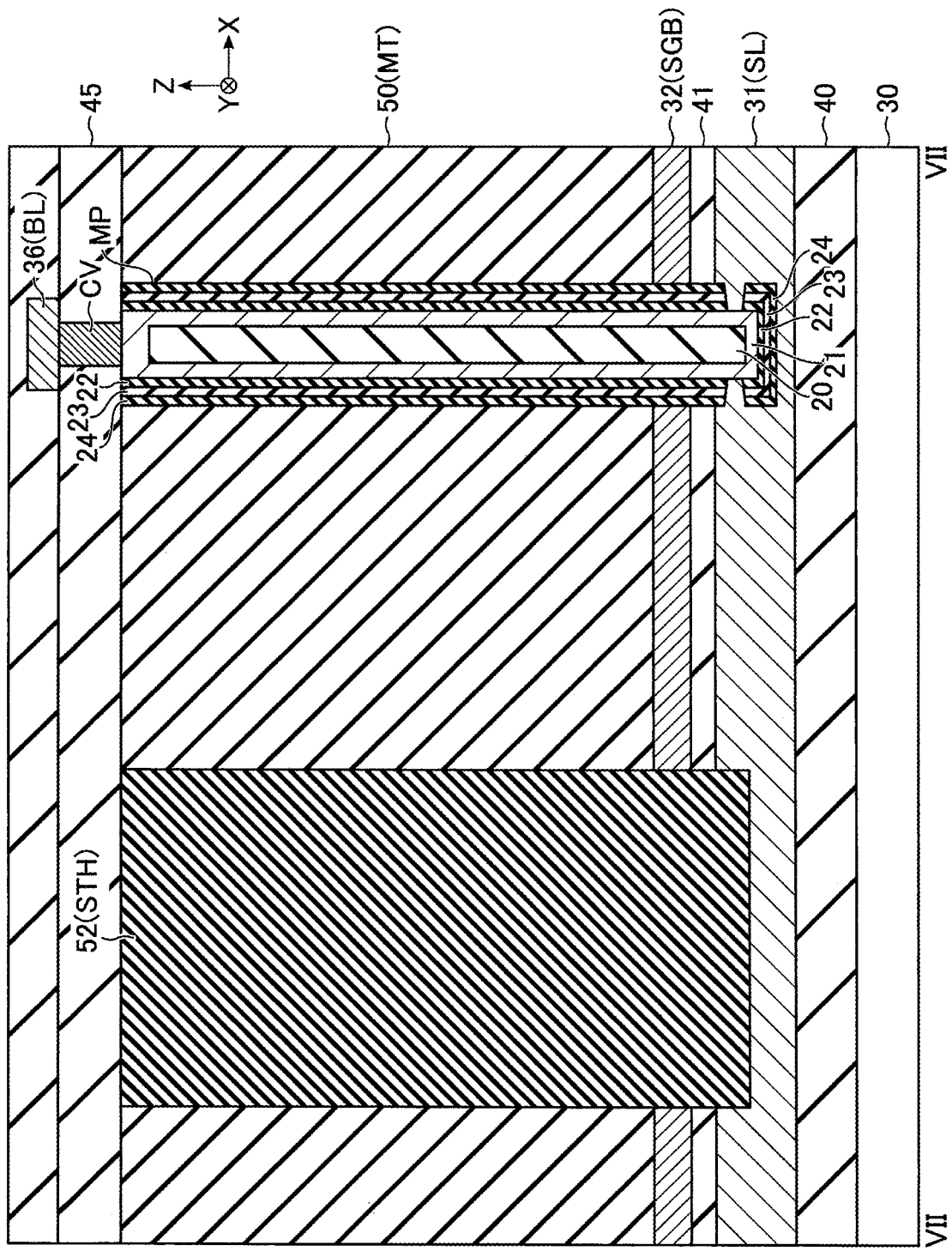
FIG. 7 is a cross-sectional view, taken along line VII-VII in FIG. 5, showing an exemplary cross-sectional structure of the memory cell array in the semiconductor memory device according to the embodiment.

FIG. 7 is a cross-sectional view of the structure of FIG. 5, taken along line showing an exemplary cross-sectional structure of the memory cell array 10 including a memory trench MT and a replacement hole STH arranged apart from the boundary of the blocks BLK. As illustrated in FIG. 7, the memory cell array 10 further includes the insulator 52.

The replacement hole STH divides the memory trench MT (insulator 50), penetrating the conductive layer 32 and insulating layer 41. The insulator 52 is embedded in the replacement hole STH. The top end of the insulator 52 is in contact with the insulating layer 45. The bottom end of the insulator 52 is in contact with the conductive layer 31. In an area not shown, the replacement hole STH is brought into contact with each of the conductive layers 33a, 33b, 34a, 34b, 35a and 35b, and the insulating layers 42 to 44. In other words, the adjacent conductive layers 33a and 33b are electrically insulated from each other by a combination of the insulators 50 in the memory trenches MT with the memory pillars MP and the slit DIV that divides the insulator 50. Similarly, the adjacent conductive layers 34a and 34b, and the adjacent conductive layers 35a and 35b are electrically insulated from each other.

In the above described semiconductor memory device 1 according to the present embodiment, the memory cell transistors MCa and MCb adopt the insulating film 23 as a charge storage layer. The memory cell transistors MCa and MCb, and select transistors STa1, STb1, STa2, STb2 and STB share a channel (semiconductor layer 21). A set of select transistors STa1 and STa2 and memory cell transistors MCa0 to MCa7 arranged in the Z direction corresponds to a NAND string NSa. A set of select transistors STb1 and STb2 and memory cell transistors MCb0 to MCb7 arranged in the Z direction corresponds to a NAND string NSb.

The memory cell transistors MCa0 to MCa7 and select transistors STa1 and STa2 face the memory cell transistors MCb0 to MCb7 and select transistors STb1 and STb2, respectively, in a direction parallel to the surface of the semiconductor substrate 30 (e.g., Y direction). In other words, the memory cell transistors MCa0 to MCa7 and select transistors STa1 and STa2 are arranged adjacent to the memory cell transistors MCb0 to MCb7 and select transistors STb1 and STb2, respectively, through the medium of an area divided by the memory trench MT.

[1-2] Effects of Present Embodiment

The above described semiconductor memory device 1 according to the present embodiment can reduce the power consumption of the semiconductor memory device 1. The effects of the semiconductor memory device 1 according to the present embodiment will be described in detail below.

In order to increase the memory density of a semiconductor memory device having three-dimensionally stacked memory cells, the memory pillar MP may be divided in two regions for operation. For instance, the semiconductor memory device may be configured to independently control the stacked wirings such as word lines WL that are in contact with the memory pillar MP by dividing the wirings into two so that a memory pillar MP can function as two NAND strings NSa and NSb.

In such a semiconductor memory device, memory trenches MT are provided in order to divide the memory cell transistors MC and stacked wirings. When memory trenches MT are formed, a replacement process using slits cannot be conducted, and therefore a replacement process using replacement holes STH is conducted instead. When the replacement process using replacement holes STH is adopted, boundaries of blocks BLK are formed by the memory trenches MT. Thus, various constraints are placed on the arrangement of the memory trenches MT.

Figure 8:
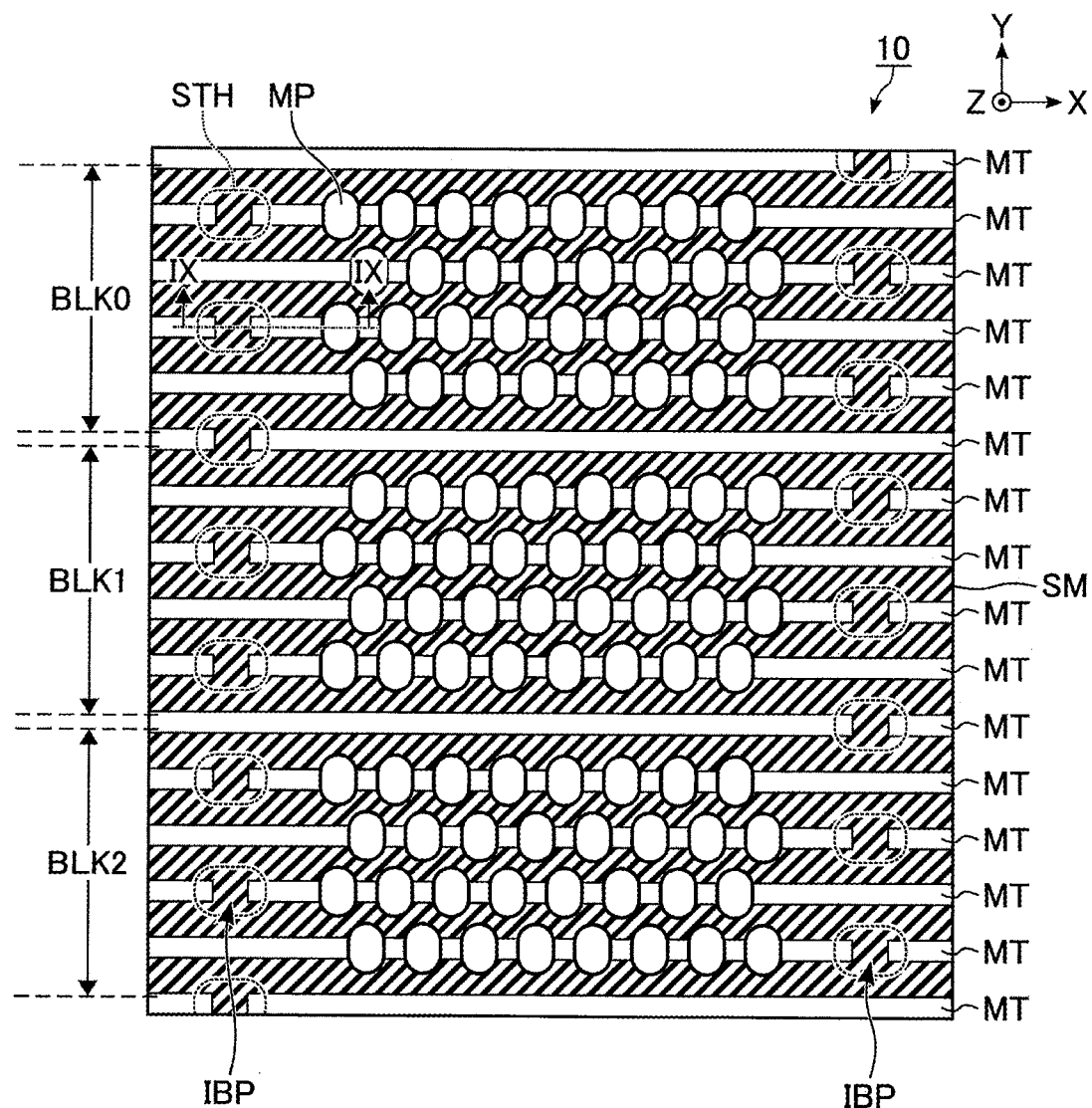
FIG. 8 is a plan view showing an exemplary planar layout of a memory cell array during the manufacture of a semiconductor memory device according to the embodiment.
Figure 9:
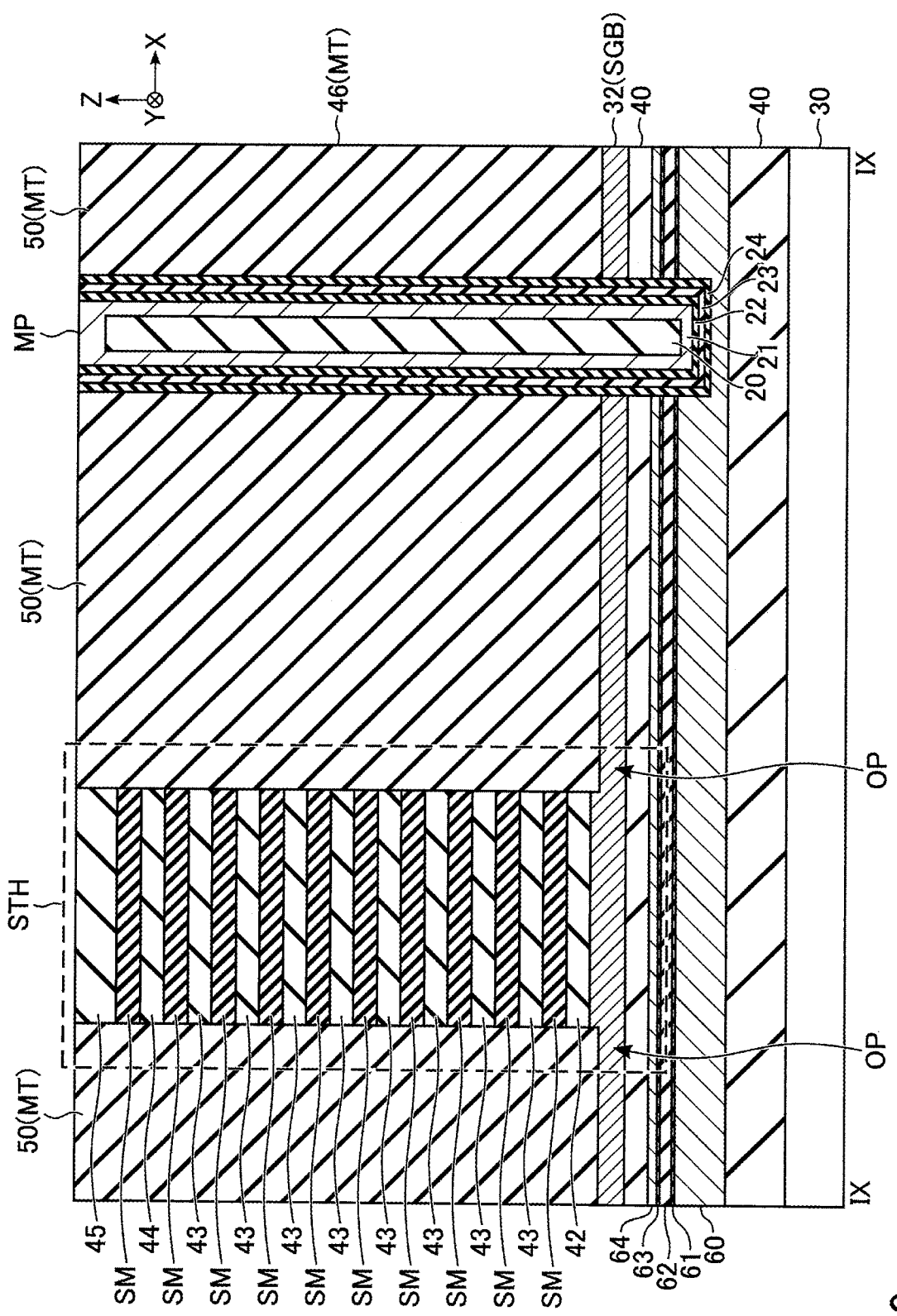
FIG. 9 is a plan view, taken along line IX-IX in FIG. 8, showing an exemplary cross-sectional structure of a memory cell array during the manufacture of a semiconductor memory device according to the embodiment.

The method for forming separated stacked wirings will be briefly explained below. First, to form the separated stacked wirings, sacrificial members SM and insulating layers are alternately provided. Next, memory trenches MT are formed to separate the stacked sacrificial members SM, and an insulator is embedded in the memory trenches MT. Thereafter, memory pillars MP are formed to overlap the memory trenches MT. An exemplary structure of the memory cell array 10 at this point of the manufacturing process is illustrated in FIGS. 8 and 9. FIG. 8 shows an exemplary planar layout of the memory cell array 10 during the manufacture of the semiconductor memory device 1 according to the present embodiment, focusing on the wirings for the word lines WL. FIG. 9 is a cross-sectional view of the structure of FIG. 8, taken along line IX-IX.

As illustrated in FIG. 8, the memory trenches MT may be formed so that the memory trenches are separated in areas where the replacement holes STH will be formed. The stacked sacrificial members SM are therefore formed to be continuous in the portions where the memory trenches MT are separated. The portions of the continuously arranged sacrificial members SM will be referred to as inclination prevention portions IBP below. The inclination prevention portions IBP prevent the stacked structure from collapsing when forming the memory trenches MT. The sacrificial members SM are removed from the inclination prevention portion IBP when forming the replacement holes STH. In this manner, the stacked sacrificial members SM are divided in correspondence with the wirings including the word lines WLa and WLb.

To separate the sacrificial members SM, it is preferable that the memory trenches MT in the vicinity of the inclination prevention portions IBP be arranged to partly overlap the replacement holes STH. There is a risk, however, of the overlapping portions OP of the memory trenches MT and replacement holes STH being overly etched when processing the replacement holes STH. That is, an undesired step may be formed during the processing of the replacement holes STH due to the overlapping portions OP.

In the semiconductor memory device 1, a source line SL is formed by the replacement process using the replacement holes STH in the same manner as word lines WL. For this process, a semiconductor layer 60, protective layer 61, sacrificial member 62, protective layer 63, and semiconductor layer 64 are stacked in the portion corresponding to the source line SL before the formation of the replacement holes STH, as illustrated in FIG. 9.

In the replacement process for a source line SL, first, the protective layers 61 and 63 and sacrificial member 62 are removed through a replacement hole STH, and also part of the block insulating film 24, insulating film 23 and tunnel insulating film 22 is removed from the side surface of the memory pillar MP. By embedding a semiconductor into the space created by the removed sacrificial member 62 and the like, a conductive layer 31 is formed to serve as a source line SL.

In the replacement process of the source line SL, it may be preferable that the bottom of the replacement hole STH be stopped by the sacrificial member 62. With the conductive layer 32 divided by the memory trench MT, however, over-etching may occur in the overlapping portion OP, making the replacement hole STH penetrate the protective layer 61. If this is the case, the stacked structure corresponding to the source line SL may be processed into an undesirable form at the step of removing the sacrificial member 62 and protective layers 61 and 63, which may result in faulty short-circuiting of the source line SL.

From the above aspect, it may be preferable that the bottom of the memory trench MT be stopped by the conductive layer 32, which is used as an etch stopper in the deep hole or deep trench processing. With the memory trench MT stopped by the conductive layer 32, the select gate lines SGD and SGS and word lines WL are divided for each block BLK, but on the other hand, a select gate line SGB will be formed as one body for the blocks BLK. This means that block-by-block control of the select transistor STB cannot be conducted, which may increase the power consumption in accordance with the operation of driving the select gate line SGB.

In contrast, in the semiconductor memory device 1 according to the present embodiment, the conductive layer 32 is divided by the slits DIV before the step of stacking the sacrificial members SM. The slits DIV are provided so as not to overlap any of the memory trenches MT, replacement holes STH, and memory pillars MP, and an oxide film may be embedded in the slits DIV.

With such an arrangement, the semiconductor memory device 1 according to the present embodiment maintains the etch stopper (conductive layer 32) to be used for processing of the memory trenches MT, replacement holes STH, and memory pillars MP, while separating the select gate line SGB for each block BLK. Thus, in the semiconductor memory device 1 according to the present embodiment, block-by-block control of the select gate line SGB can be conducted, thereby reducing the power consumption. Furthermore, in the semiconductor memory device 1 according to the present embodiment, the conductive layer 32 can be used as an etch stopper for processing the memory trench MT, replacement hole STH, and memory pillar MP. Thus, any failure owing to the source line SL can be suppressed.

[2] Other Modification Examples

In the above embodiment, the semiconductor layer 21 in the memory pillar MP is electrically coupled to the conductive layer 31 (source line SL) via the side surface of the memory pillar MP. The structure, however, is not limited thereto. For instance, in the semiconductor memory device 1, the semiconductor layer 21 of the memory pillar MP may be coupled to the source line SL, via the bottom portion of the memory pillar MP.

Figure 10:
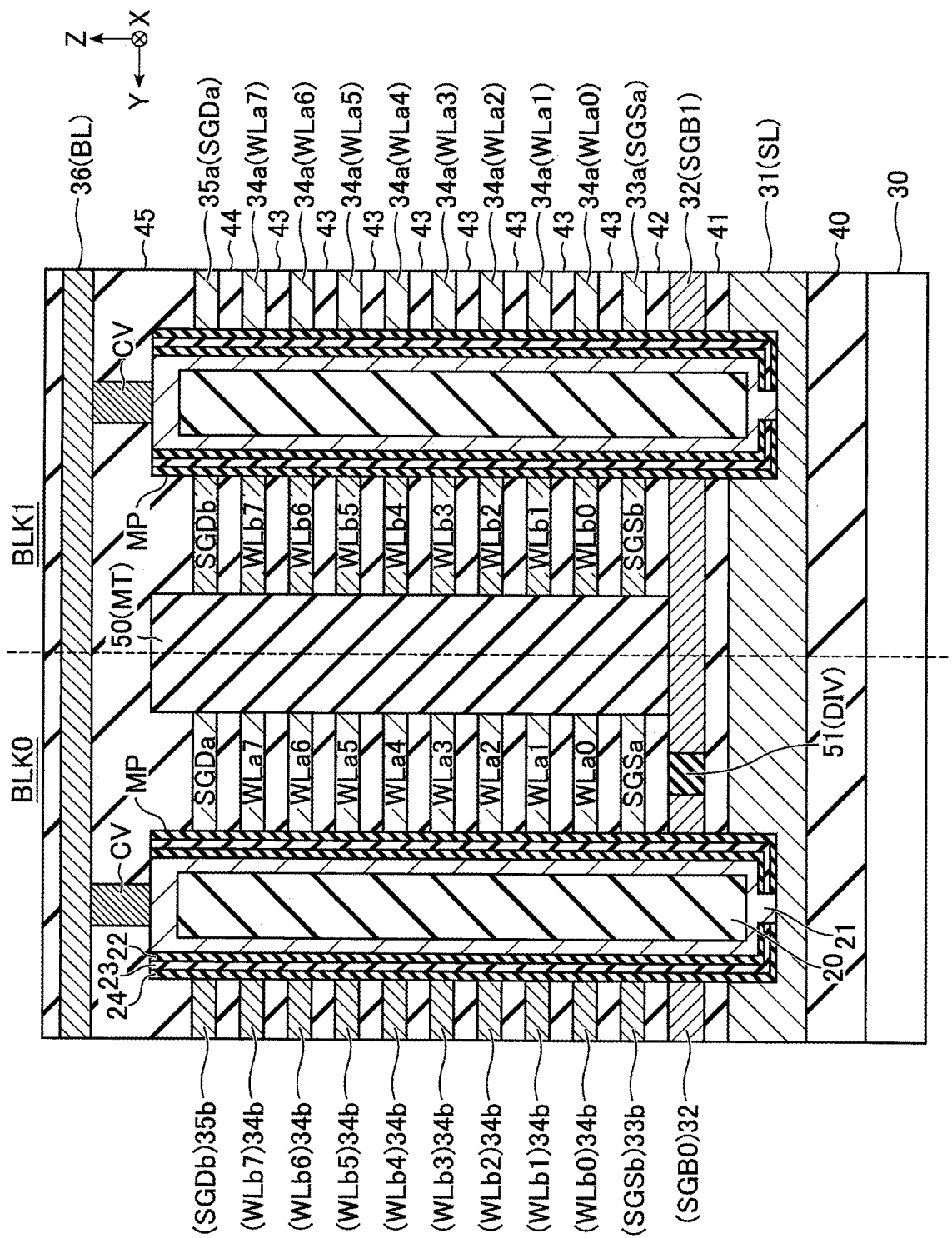
FIG. 10 is a cross-sectional view showing a cross-sectional structure of a memory cell array in the semiconductor memory device according to a modification example of the embodiment.

FIG. 10 shows an exemplary cross-sectional structure of a memory cell array 10 in the semiconductor memory device 1 according to a modification example of the embodiment. The area similar to FIG. 6 is illustrated. In the semiconductor memory device 1 according to the modification example, the block insulating film 24, insulating film 23, and tunnel insulating film 22 at the bottom of the memory pillar MP are partially removed, as illustrated in FIG. 10. The semiconductor layer 21 in the memory pillar MP is therefore brought into contact with the conductive layer 31 at the bottom of the memory pillar MP. With a slit DIV provided in a similar manner to the embodiment, the same effects as the embodiment can be achieved in this arrangement.

In the embodiment, an example of the select gate line SGB of two adjacent blocks BLK being divided by a single slit DIV has been explained. The select gate line SGB of the adjacent blocks BLK, however, may be divided by two or more slits DIV. The slits DIV suffice as long as they can divide the select gate line SGB for at least adjacent blocks BLK and are arranged apart from the memory pillar MP, replacement hole STH, and memory trench MT in a planar view. The number of slits DIV can be freely determined.

In the embodiment, the charge storage layer of the memory cell transistors MC is explained as an insulating film. However, a semiconductor or a conductor such as metal may be adopted as a charge storage layer. That is, the semiconductor memory device 1 may include floating-gate memory cell transistors MC, in which the insulating film 23 is replaced with a conductor. The structure of a memory cell transistor MC is designed in accordance with the structure of the charge storage layer of the memory pillar MP.

For instance, if the charge storage layer is divided for every memory cell transistor MC in both the Y and Z directions in each memory pillar MP, a charge storage layer can be either insulating film or a conductor. The conductor adopted for the charge storage layer may have a stacked structure including two or more types of semiconductor, metal and insulator. On the other hand, if the charge storage layer is not divided for every memory cell transistor MC in both the Y and Z directions in a memory pillar MP, an insulating film is adopted as a charge storage layer.

Each of the tunnel insulating film and block insulating film corresponding to the same memory group MG may be shared by or separated for the transistors in the NAND strings NSa and NSb, regardless of the charge storage layer being divided or not divided in the Y and Z directions for each memory cell transistor MC. Furthermore, if the tunnel insulating film and block insulating film corresponding to the same memory group MG extend in the Z direction in the memory pillar MP, these insulating films may be divided for each memory cell transistor MC.

A memory pillar MP in the embodiment may be two or more pillars connected in the Z direction. Alternatively, a memory pillar MP may be a pillar corresponding to the select gate line SGD connected to a pillar corresponding to the word lines WL. The arrangement of memory pillars MP is not limited to four staggered rows, but may be freely made. The number of bit lines BL overlapping a memory pillar MP can be freely designed.

In the embodiment, the memory cell array 10 may include one or more dummy word lines between the word line WL0 and select gate line SGS, and between the word line WL7 and select gate line SGD. When dummy word lines are provided, dummy transistors are arranged between the memory cell transistor MC0 and select transistor ST2 and between the memory cell transistor MC7 and select transistor ST1 in such a manner as to correspond to the number of dummy word lines. A dummy transistor has the same structure as a memory cell transistor MC but is not used for data storage. If two or more memory pillars MP are connected in the Z direction, a memory cell transistor MC in the vicinity of the connected portion of the pillars may be used as a dummy transistor.

In the embodiment, the structure of the semiconductor memory device 1 having a circuit such as a sense amplifier module 16 underneath the memory cell array 10 has been explained, but the structure is not limited thereto. For instance, the semiconductor memory device 1 may have a structure in which a chip having a sense amplifier module 16 and a chip having a memory cell array 10 are adhered to each other.

In the drawings used for the explanation of the embodiment, a memory pillar MP maintains a uniform outside diameter from the top layer to the bottom layer, but is not limited thereto. For instance, a memory pillar MP may be tapered or reverse tapered, or may be bulged in the middle. Similarly, a replacement hole STH may be tapered or reverse tapered, or may be bulged in the middle.

The term "coupling" throughout the specification refers to electrical coupling, and therefore it may include coupling by way of other elements. The expression "electrically coupled" may be coupling of components with an insulator interposed between as long as the components are able to operate in the same manner as in the situation of being electrically coupled without anything between. A "pillar" refers to a structure arranged in a hole formed in the process of producing a semiconductor memory device 1.

The embodiments of the present invention have been explained. These embodiments are presented merely as examples and are not intended to restrict the scope of the invention. Novel embodiments may be realized in various other forms, and various omissions, replacements, and changes can be made without departing from the gist of the invention. Such embodiments and modifications are included in the scope and gist of the invention, and are included in the scope of the invention described in the claims and their equivalence.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a first conductive layer provided above the substrate;
a second conductive layer provided above the first conductive layer;
a third conductive layer and a fourth conductive layer provided above the second conductive layer, the third conductive layer and the fourth conductive layer being separated from each other in a first direction;
a fifth conductive layer provided in the same level of a layered structure as the third conductive layer above the second conductive layer, the fifth conductive layer being separated from the third conductive layer;
a sixth conductive layer provided in the same level of the layered structure as the fourth conductive layer above the second conductive layer, the sixth conductive layer being separated from the fourth conductive layer;
a plurality of first insulating regions provided between the third conductive layer and the fifth conductive layer and between the fourth conductive layer and the sixth conductive layer, along a second direction intersecting the first direction;
a first pillar provided between the first insulating regions and penetrating the second conductive layer along the first direction, the first pillar including a first semiconductor layer and a first insulating layer, the first semiconductor layer being in contact with the first conductive layer, the first insulating layer provided between the first semiconductor layer and the second to sixth conductive layers;
a seventh conductive layer provided in the same level of the layered structure as the second conductive layer above the first conductive layer, the seventh conductive layer being separated from the second conductive layer;
an eighth conductive layer and a ninth conductive layer provided above the seventh conductive layer and being separated from each other in the first direction;
a tenth conductive layer provided in the same level of the layered structure as the eighth conductive layer above the seventh conductive layer, the tenth conductive layer being separated from the eighth conductive layer;
an eleventh conductive layer provided in the same level of the layered structure as the ninth conductive layer above the seventh conductive layer, the eleventh conductive layer being separated from the ninth conductive layer;
a plurality of second insulating regions provided along the second direction between the eighth conductive layer and the tenth conductive layer and between the ninth conductive layer and the eleventh conductive layer;
a second pillar provided between the second insulating regions and penetrating the seventh conductive layer along the first direction, the second pillar including a second semiconductor layer and a second insulating layer, the second semiconductor layer being in contact with the first conductive layer, the second insulating layer being provided between the second semiconductor layer and the seventh to eleventh conductive layers;
a third insulating region provided between the third to sixth conductive layers and the eighth to eleventh conductive layers along the second direction; and
a fourth insulating region provided between the second conductive layer and the seventh conductive layer, the fourth insulating region being separated from the third insulating region in a planar view.

2. The device of claim 1, wherein
the fourth insulating region is provided between the first pillar and the second pillar in a planar view.

3. The device of claim 1, wherein
the first pillar and the second pillar are both separated from the fourth insulating region.

4. The device of claim 1, wherein
the fourth conductive layer and the eighth conductive layer are arranged adjacent to each other with the third insulating region interposed between in a third direction intersecting the first direction and the second direction, and
the fifth conductive layer and the ninth conductive layer are arranged adjacent to each other with the third insulating region interposed between in the third direction.

5. The device of claim 4, further comprising:
a third pillar penetrating either one of the second conductive layer or the seventh conductive layer and extending along the first direction, the third pillar including a third insulating layer between the third to sixth conductive layers and the eighth to eleventh conductive layers.

6. The device of claim 5, wherein
the third pillar divides the third insulating region in the second direction, and
the third insulating layer is in contact with each of the fourth conductive layer, the fifth conductive layer, the eighth conductive layer, and the ninth conductive layer.

7. The device of claim 5, wherein
the fourth insulating region is separated from the third insulating region in the third direction in a planar view.

8. The device of claim 5, wherein
the fourth insulating region includes a portion provided along a side surface of the third pillar in a planar view.

9. The device of claim 5, wherein
the third insulating region overlaps either one of the second conductive layer and the seventh conductive layer in a planar view.

10. The device of claim 1, wherein
the first semiconductor layer is in contact with the first conductive layer via a side surface of the first pillar, and
the second semiconductor layer is in contact with the first conductive layer via a side surface of the second pillar.

11. The device of claim 1, wherein
a portion between the first pillar and the third conductive layer functions as part of a first memory cell transistor,
a portion between the first pillar and the fourth conductive layer functions as part of a second memory cell transistor,
a portion between the first pillar and the fifth conductive layer functions as part of a third memory cell transistor,
a portion between the first pillar and the sixth conductive layer functions as part of a fourth memory cell transistor,
a portion between the second pillar and the eighth conductive layer functions as part of a fifth memory cell transistor,
a portion between the second pillar and the ninth conductive layer functions as part of a sixth memory cell transistor,
a portion between the second pillar and the tenth conductive layer functions as part of a seventh memory cell transistor, and
a portion between the second pillar and the eleventh conductive layer functions as part of an eighth memory cell transistor.

12. The device of claim 1, wherein
each of the third to sixth conductive layers and the eighth to eleventh conductive layers extends in the second direction.

13. The device of claim 1, further comprising:
a twelfth conductive layer provided above the third to sixth conductive layers and the eighth to eleventh conductive layers;
a first contact provided between the first semiconductor layer and the twelfth conductive layer; and
a second contact provided between the second semiconductor layer and the twelfth conductive layer, wherein
the first conductive layer is used as a source line,
the second conductive layer is used as a first source-side select gate line,
the seventh conductive layer is used as a second source-side select gate line,
the third to sixth and eighth to eleventh conductive layers are used as first to eighth word lines, respectively, and
the twelfth conductive layer is used as a bit line.

14. The device of claim 13, wherein
the first and second source-side select gate lines and the first to eighth word lines are independently controlled.

15. The device of claim 13, further comprising:
a thirteenth conductive layer provided above the fourth conductive layer, adjacent to the first semiconductor layer with the first insulating layer interposed between;
a fourteenth conductive layer provided above the sixth conductive layer, adjacent to the first semiconductor layer with the first insulating layer interposed between;
a fifteenth conductive layer provided above the ninth conductive layer, adjacent to the second semiconductor layer with the second insulating layer interposed between; and
a sixteenth conductive layer provided above the eleventh conductive layer, adjacent to the second semiconductor layer with the second insulating layer interposed between, wherein
the thirteenth conductive layer is used as a first drain-side select gate line,
the fourteenth conductive layer is used as a second drain-side select gate line,
the fifteenth conductive layer is used as a third drain-side select gate line, and
the sixteenth conductive layer is used as a fourth drain-side select gate line.

16. The device of claim 15, wherein
the first drain-side select gate line, the second drain-side select gate line, the third drain-side select gate line, and the fourth drain-side select gate line are independently controlled.

17. The device of claim 1, wherein
the second conductive layer and the seventh conductive layer each include phosphorus-doped silicon.

18. The device of claim 1, wherein
the third to sixth conductive layers and the eighth to eleventh conductive layers each include tungsten.

* * * * *